(12) United States Patent
Saint-Laurent et al.

(10) Patent No.: US 7,724,058 B2
(45) Date of Patent: May 25, 2010

(54) LATCH STRUCTURE AND SELF-ADJUSTING PULSE GENERATOR USING THE LATCH

(75) Inventors: Martin Saint-Laurent, Austin, TX (US); Paul Bassett, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 11/930,915

(22) Filed: Oct. 31, 2007

(65) Prior Publication Data

US 2009/0108895 A1 Apr. 30, 2009

(51) Int. Cl.
*H03K 3/00* (2006.01)
(52) U.S. Cl. .................. 327/291; 327/172; 327/298; 327/299
(58) Field of Classification Search .............. None
See application file for complete search history.

(56) References Cited

U.S. PATENT DOCUMENTS

| | | | |
|---|---|---|---|
| 4,768,167 A | 8/1988 | Yoder | |
| 5,557,225 A * | 9/1996 | Denham et al. | 327/199 |
| 5,764,089 A | 6/1998 | Partovi et al. | |
| 5,825,225 A * | 10/1998 | Sugisawa et al. | 327/208 |
| 5,886,529 A | 3/1999 | Wakamatsu | |
| 6,701,339 B2 | 3/2004 | Vangal et al. | |
| 6,937,079 B1 | 8/2005 | Zhao et al. | |
| 7,042,267 B1 * | 5/2006 | Pasqualini | 327/291 |
| 7,046,066 B2 * | 5/2006 | Saado et al. | 327/291 |
| 7,256,621 B2 | 8/2007 | Lih et al. | |
| 2009/0058463 A1 | 3/2009 | Saint-Laurent et al. | |

FOREIGN PATENT DOCUMENTS

| | | |
|---|---|---|
| EP | 0401865 | 12/1990 |
| JP | 62188515 | 8/1987 |
| JP | 2003-133916 | 5/2003 |

OTHER PUBLICATIONS

International Search Report - PCT/US08/081778, International Searching Authority - European Patent Office, Sep. 7, 2009.
Written Opinion - PCT/US08/081778, International Searching Authority - European Patent Office, Sep. 7, 2009.

\* cited by examiner

*Primary Examiner*—An T Luu
(74) *Attorney, Agent, or Firm*—Peter M. Kamarchik; Nicholas J. Pauley; Sam Talpalatsky (57) ABSTRACT

The disclosure includes a latch structure and self-adjusting pulse generator using the latch. In an embodiment, the system includes a first latch and a pulse generator coupled to provide a timing signal to the first latch. The pulse generator includes a second latch that has characteristics matching the first latch.

20 Claims, 7 Drawing Sheets

LATCH STRUCTURE AND SELF-ADJUSTING PULSE GENERATOR USING THE LATCH

I. FIELD

The present disclosure is generally related to sequential elements, such as latch devices.

II. DESCRIPTION OF RELATED ART

Advances in technology have resulted in smaller and more powerful personal computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and IP telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Digital integrated circuits used in portable personal computing devices, such as wireless telephone devices, may incorporate pulse latches. Pulse latches are clocked devices that output a value received at an input. A pulse latch may read an input when a clock pulse goes high and hold an output when the clock pulse goes low. Due to a data propagation delay between the input and the output of a pulse latch, a clock pulse that has too short a duration may cause the pulse latch to fail to output the value at the input. However, a clock pulse that is too long in duration may cause the latch to first output a signal at the input of the latch when the clock pulse goes high, and to continue to output signals received at the input until the clock pulse goes low. When multiple pulse latches are arranged sequentially, this condition can result in data passing through more than one sequential element per clock pulse, known as a race condition.

In general, power consumption in portable electronic devices can be reduced by operating at a lower voltage. Pulse latch performance can be affected by operating voltage, as well as other conditions such as temperature and manufacturing process. As a result, a pulse latch that operates correctly with a clock pulse under one set of operating conditions may fail to operate correctly with the same clock pulse under another set of operating conditions.

III. SUMMARY

In a particular embodiment, a system is disclosed that includes a first latch and a pulse generator coupled to provide a timing signal to the first latch. The pulse generator includes a second latch that has characteristics, such as delay time and variability to environmental factors, matching the first latch.

In another particular embodiment, a pulse generator is disclosed. The pulse generator includes a latch responsive to a clock input. The pulse generator also includes a logic circuit coupled to the clock input and coupled to an output of the latch. The logic circuit provides a pulse output that includes at least one pulse having a pulse width that varies in response to a data propagation time of the latch.

In another particular embodiment, a latch is disclosed. The latch includes a first transistor and a second transistor. The latch also includes a data line that is coupled, via a first inverter, to a terminal of the first transistor and that is coupled, via a second inverter that is coupled to the first inverter, to a terminal of the second transistor.

In another particular embodiment, a method is disclosed that includes receiving a clock signal at a delay element in a pulse generator. The method also includes providing an output pulse signal from the pulse generator to a pulse based latch. The delay element has timing delay characteristics that track a data propagation delay of the pulse based latch. The pulse based latch may be a pulse latch that is configured to enable robust low voltage operation.

In another particular embodiment, a method is disclosed that includes providing a first pulse signal with pulses having a first pulse width to a plurality of serial coupled latches during a first operating condition. The first operating condition is affected by an environmental factor. The method also includes providing a second pulse signal with pulses having a second pulse width to the plurality of serial coupled latches during a second operating condition. The second operating condition is affected by a second environmental factor. The second pulse width varies with respect to the first pulse width in response to a difference between the second environmental factor and the first environmental factor. The variance of the second pulse width substantially matches a variability of at least one of the plurality of serially coupled latches.

A particular advantage provided by disclosed embodiments is improved operation over a range of operating conditions since a pulse generator provides a pulse output that varies based on the operating conditions.

Other aspects, advantages, and features of the present disclosure will become apparent after review of the entire application, including the following sections: Brief Description of the Drawings, Detailed Description, and the Claims.

V. DETAILED DESCRIPTION

Figure 1:
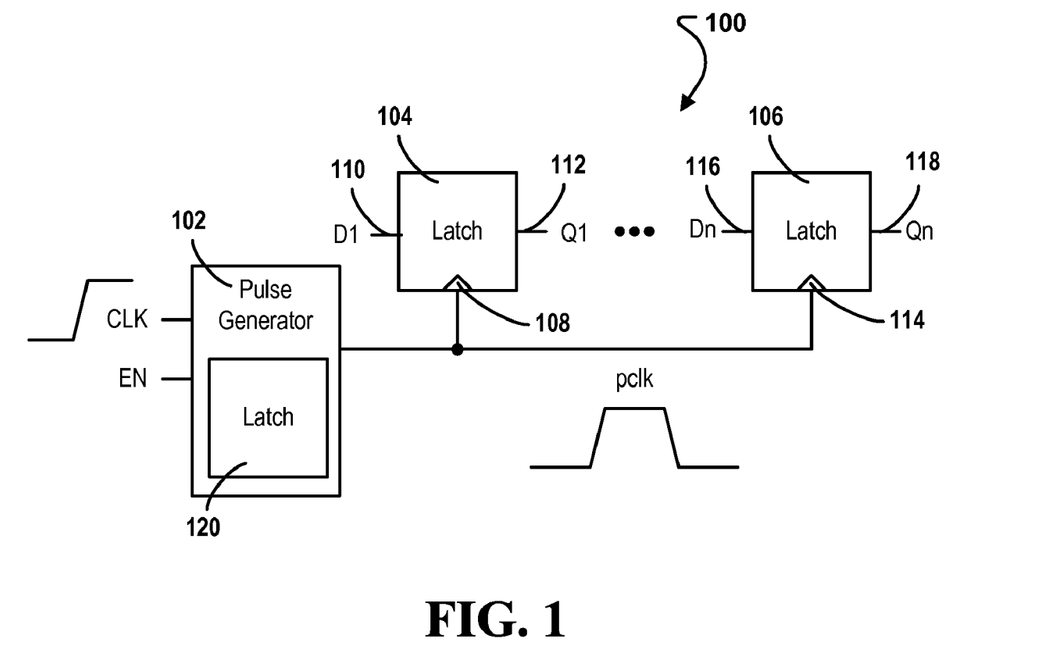
FIG. 1 is a block diagram of an embodiment of a system including a self-adjusting pulse generator.

Referring to FIG. 1, a system including a self-adjusting pulse generator is depicted and generally designated 100. The system 100 includes a pulse generator circuit 102 that includes a latch 120. The pulse generator circuit 102 is coupled to provide a clock pulse signal to a plurality of latches, such as a plurality of serially coupled latches, including a first latch 104 and an Nth latch 106. The first latch 104 is coupled to the pulse generator 102 via a clock input 108 and has a data input (D1) 110 and a data output (Q1) 112. The Nth latch 106 is coupled to the pulse generator 102 via a clock input 114 and has a data input (Dn) 116 and a data output (Qn) 118.

In a particular embodiment, the first latch 104 and the Nth latch 106 comprise the first and last latch elements of a sequence of multiple serially coupled latches. For example, the data output 112 of the first latch 104 may be coupled to a data input of a second latch (not shown). Likewise, the second latch may have a data output that is coupled to a data input of a third latch (not shown). The data input 116 of the Nth latch 106 may be coupled to an output of a series of sequentially coupled latches, and the data output (Qn) 118 of the Nth latch 106 may represent an output of a sequential element circuit. In a particular embodiment, the serially coupled sequential elements function as a delay circuit.

In a particular embodiment, the first latch 104 is a pulse latch that operates to provide a signal at the data input 110 to the data output 112 in response to a pulse signal received at the clock input 108. A pulse latch operation may begin when a clock input signal transitions from a low state to a high state (e.g., from a logical "0" state to a logical "1" state). While the clock input signal remains high, data at the data input 110 is transferred to the data output 112 of the latch 104. When the clock signal returns to a low state, the data value at the output 112 of the latch is held as the latch output until the clock signal returns to a high state. In a particular embodiment, each of the latches, including the Nth latch 106, functions in a substantially similar manner as the first latch 104.

Proper operation of the latches 104, 106 as a sequential element circuit requires a clock pulse width having an appropriate duration. Each latch 104, 106 has an associated delay that reflects a data propagation time to transfer a signal from the data input 110, 116 to the respective data output 112, 118. A clock pulse (e.g., the portion of a clock cycle signal that is in the high state) that is too short does not provide sufficient time for data at the data input of a latch to propagate to the data output of the latch. Likewise, a clock pulse that is too long in duration may result in a race condition, where a signal at the data input of the latch propagates to the output of the latch, and during the same clock pulse, a new signal at the data input that is output by the prior latch also propagates though the latch.

The data propagation time for the latches 104, 106 may differ depending on an operating characteristic or environment of the system 100. For example, the data propagation time for each of the latches 104, 106 may be affected by a temperature, an operating voltage, and a manufacturing process. Latches in close proximity and having the same manufacturing process will tend to have similar operating characteristics, such as the data propagation time. As an example, a change in operating temperature that increases the data propagation time of one of the latches 104, 106 will tend to increase the data propagation time of each of the latches 104, 106 by substantially the same amount.

To accommodate a variable propagation time of the latches 104, 106, the pulse generator 102 includes an internal latch 120 having similar characteristics as the latches 104 and 106. The latch 120 is used as a delay element to enable operation as a self-adjusting pulse generator 102. For example, the latch 120 may be fabricated using the same manufacturing process, having the same topography, and otherwise being substantially the same as each of the latches 104, 106 of the sequential element circuit. Characteristics of the latch 120 will therefore substantially track characteristics of each of the latches 104, 106 as operating characteristics of the system 100 may vary. As an example, changes in propagation time due to a temperature or a voltage may cause similar changes to each of the latches 104, 106, and 120. By using a data propagation time of the latch 120 to generate an output clock pulse, the pulse generator 102 can generate an output pulse signal having a sufficient width to correctly clock data through the multiple serially coupled latches 104, 106, under various operating conditions, without use of external control signals and without requiring receipt of a feedback signal from the latches 104, 106.

For example, in a particular embodiment, each of the latches 104, 106, and the pulse generator 102 operates at a low voltage condition (e.g., 0.7 volts or lower) to reduce power consumption. The self-adjusting pulse generator 102 generates clock pulse signals having a pulse width that is adjusted for a variation of a data propagation time of the latches 104, 106 due to the low operating voltage. Each latch 104, 106, and 120 may incorporate the latch structure 400 illustrated in FIG. 4, in which a data input is written fully differentially by a first inverter coupled to a first transistor and a second inverter coupled to a second transistor, for improved low power performance.

Figure 2:
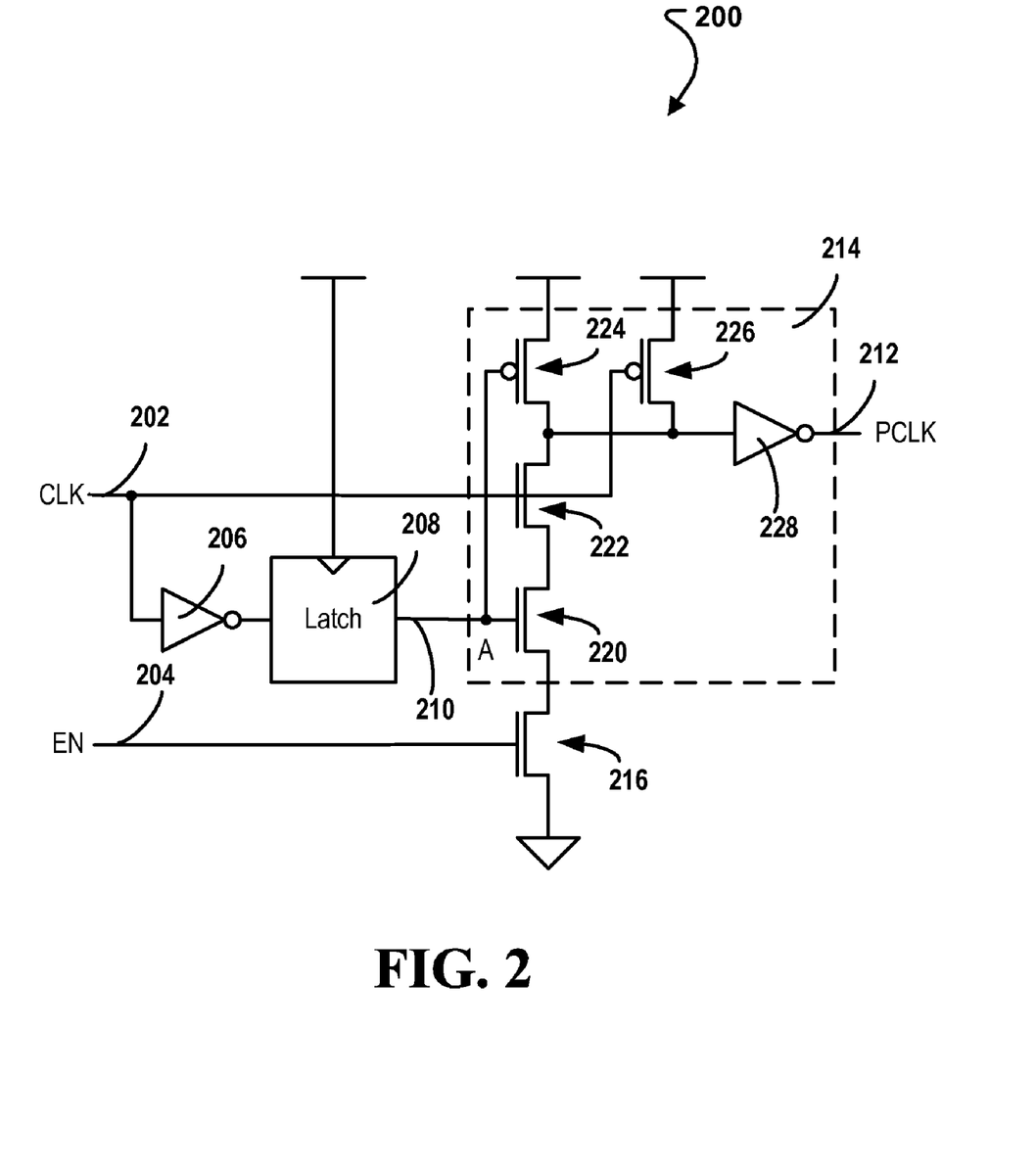
FIG. 2 is a circuit diagram of an embodiment of a self-adjusting pulse generator.

Referring to FIG. 2, a particular embodiment of a self-adjusting pulse generator is depicted and generally designated 200. In a particular embodiment, the system 200 is incorporated into the pulse generator 102 of FIG. 1. The system 200 includes a clock (CLK) input 202, an enable (EN) input 204, and a pulse clock (PCLK) output 212. The clock input 202 is coupled to an input of an inverter 206. An output of the inverter 206 is coupled to a data input of a latch 208. The latch 208 has a data output 210 that is coupled to an input of an AND gate 214. The AND gate 214 has a second input coupled to the clock input 202. The enable input 204 is coupled to an enable transistor 216, which in turn is coupled to the AND gate 214. In a particular embodiment, the AND gate 214 functions as a logic circuit that performs a logical AND on the clock input 202 and on the data output 210 of the latch 208 to generate the PCLK output 212. The PCLK output 212 includes at least one pulse that has a pulse width that varies in response to a data propagation time of the latch 208. In a particular embodiment, the PCLK output 212 includes a pulse signal where each pulse has a pulse width that varies in response to a data propagation time of the latch 208.

In a particular embodiment, the AND gate 214 includes a first transistor 220 having a first terminal coupled to the enable transistor 216 and having a second terminal coupled to a first terminal of a second transistor 222. The second transistor 222 has a second terminal that is coupled to a voltage supply via a third transistor 224. A fourth transistor 226 is further coupled to the voltage supply and is also coupled to the second terminal of the second transistor 222. An inverter 228 has an input coupled to the second terminal of the second transistor 222 and an output which provides the PCLK output 212. The latch output 210 is coupled to a control input of the first transistor 220 and to an inverting control input of the third transistor 224. The clock signal 202 is coupled to a control input of the second transistor 222 and to an inverting control input of the fourth transistor 226. The AND gate 214 is responsive to the enable input 204, which functions to selectively enable generation of a pulse output at the PCLK output 212.

During operation, the clock input 202 is provided to an input of the inverter 206 and the inverted clock signal is provided to a data input of the latch 208. The latch 208 has a clock input tied to a supply voltage to provide a continual high clock signal for data propagation through the latch 208. A transition of the output 210 of the latch 208 is thus delayed from a transition of the original clock input 202 by an amount of time substantially equal to a delay time of the inverter 206 and a data propagation time of the latch 208.

The AND gate 214 operates to provide a logic high value at the output 212 beginning when the clock input 202 transitions to a high signal and maintains the high output until the clock transition from the clock input 202 propagates through the latch 208. Thus, the AND gate 214 generates a pulse at the PCLK output 212 having a duration approximately equal to the delay time of the inverter 206 and the data propagation time of the latch 208. As a result, the PCLK output 212 provides pulses having a pulse width that enables proper operation of one or more latch devices that are clocked by the output 212 and that have a configuration substantially matching the configuration of the latch 208.

Thus, in a particular embodiment, as an operating condition, such as resulting from a temperature, voltage, fabrication process, another condition, or any combination thereof, affects a data propagation time through the latch 208, a pulse width generated at the output 212 varies in response to the data propagation time through the latch 208. One or more sequential data elements, such as the latches 104, 106 of FIG. 1, may thus be clocked using a pulse that self-adjusts to substantially track variations in data propagation time through each of the sequential data elements.

Figure 3:
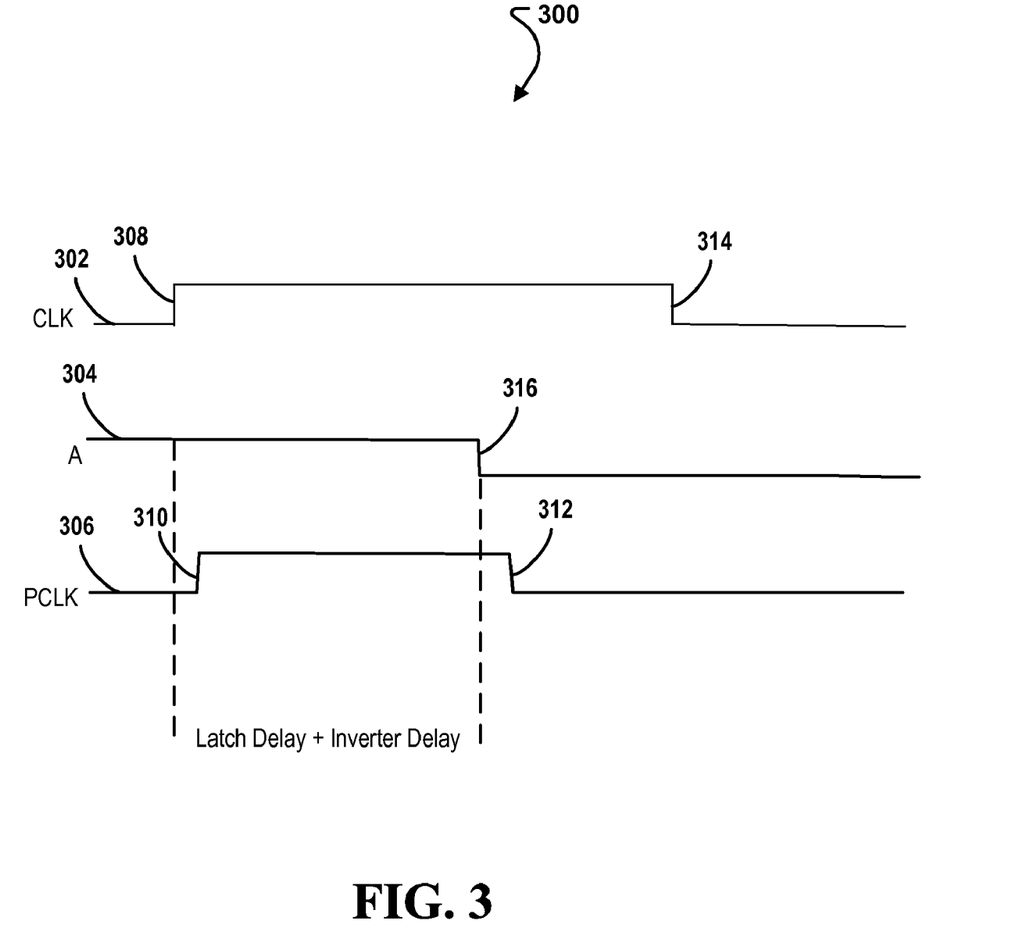
FIG. 3 is a timing diagram illustrating an operation of the system of FIG. 2.

Referring to FIG. 3, a timing diagram illustrating an operation of the system 200 of FIG. 2 is depicted and generally designated 300. The timing diagram 300 includes a clock signal 302, a reference signal 304 corresponding to a signal at the reference point A of FIG. 2 (i.e., at an output of the latch 208) and a PCLK signal 306 corresponding to the PCLK output 212 of FIG. 2. The PCLK signal 306 is generated by the AND gate 214 operating on the clock signal 302 and the reference signal 304. Relationships depicted in FIG. 3 are for illustrative purposes only and may not be to scale.

As illustrated, the clock signal 302 and the PCLK signal 306 each begin at a low state. The reference signal 304 begins at a high state that corresponds to the inverted output of the clock signal 302, as propagated through the latch 208 of FIG. 2.

At transition 308, the clock signal 302 transitions to a high state. In response, the PCLK signal 306 transitions from a low state to a high state at transition 310 after a delay introduced by the AND gate 214 of FIG. 2. Also in response to the transition 308, after a delay approximately equal to a delay time through the inverter 206 plus a data propagation time through the latch 208 of FIG. 2, the reference signal 304 transitions to a low state at transition 316.

In response to the transition 316, the PCLK signal 306 transitions from the high state to a low state at transition 312, resulting in a pulse that is triggered by the clock signal transition 308 and that has a duration that is dependent on a data propagation time of a pulse latch. The clock signal 302 returns to a low state at transition 314.

Figure 4:
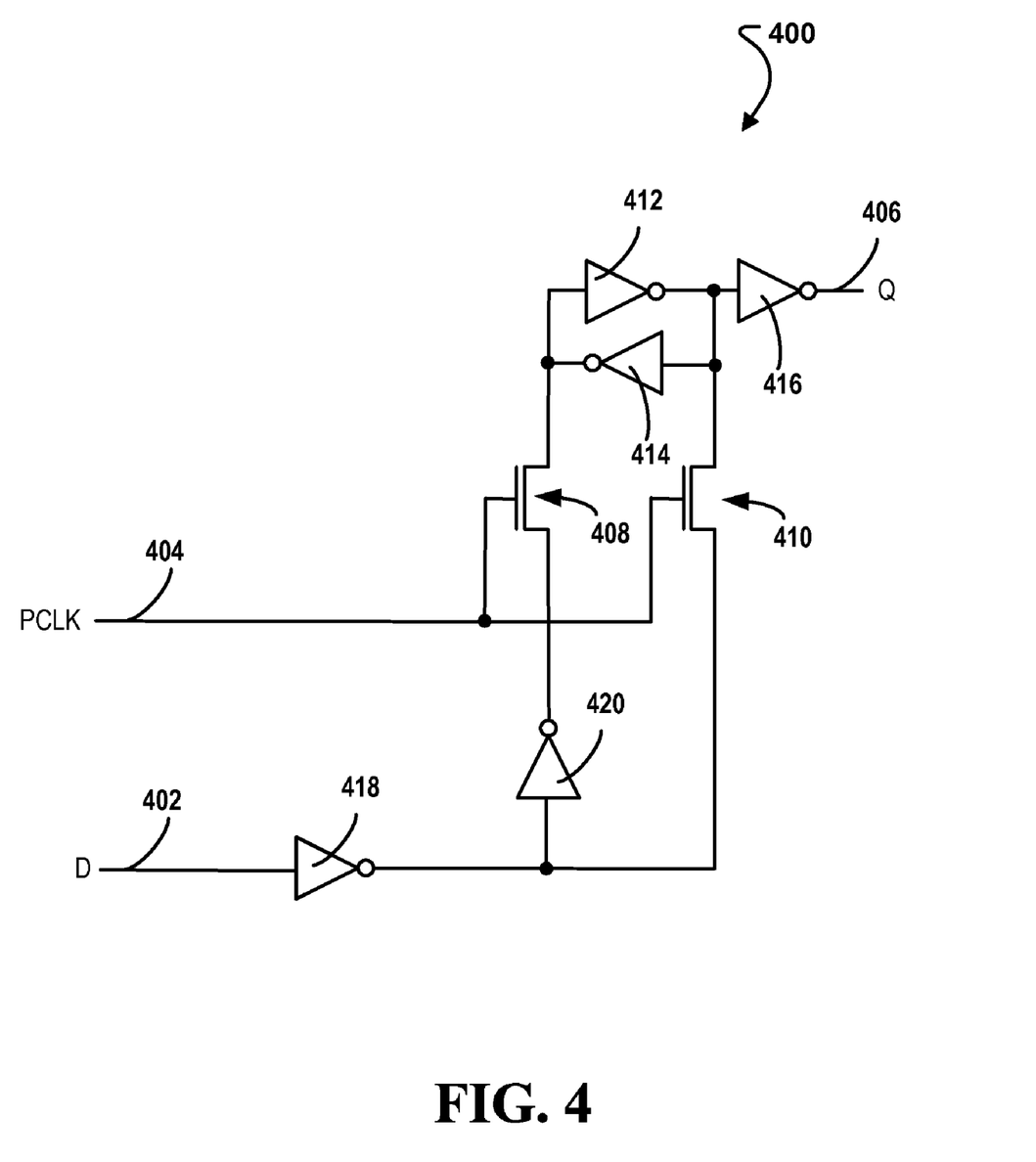
FIG. 4 is a circuit diagram of an embodiment of a latch structure.

Referring to FIG. 4, a particular illustrative embodiment of a latch structure is depicted and generally designated 400. The latch structure 400 operates as a pulse latch, and may be used as the latch 208 of FIG. 2, as the latches 104, 106, and 120 of FIG. 1, or as pulse latches in other systems. The latch structure 400 includes a data input 402 and a PCLK input 404. The latch structure 400 further includes an output (Q) 406 that is responsive to a first transistor 408 and a second transistor 410. Each of the first transistor 408 and the second transistor 410 has a control input coupled to the PCLK input 404. The data input 402 is coupled to the second transistor 410 via a first inverter 418. The data input 402 is further coupled to a terminal of the first transistor 408 via the first inverter 418 and a second inverter 420 that receives an output of the first inverter 418. A second terminal of the first transistor 408 is coupled via a cross-coupled third inverter 412 and fourth inverter 414 to a second terminal of the second transistor 410. The second terminal of the second transistor 410 is coupled to an input of an output inverter 416, which in turn provides the output (Q) 406.

During operation, when the PCLK input 404 transitions form a low state to a high state, the data input 402 is provided to the cross-coupled inverters 412 and 414 via each of the first transistor 408 and the second transistor 410, and the inverters 418 and 420. The first and second transistors 408, 410 are thus controlled by the PCLK input 404, and thus the data input 402 is written fully differentially at the first and second transistors 408, 410 by the first and second inverters 418, 420. In a particular embodiment, the cross-coupled inverters 412 and 414 are manufactured with reduced dimensions to reduce contention in response to a transition at the data input 402 via the transistors 408 and 410 and also to maintain the output 406 after the PCLK 404 input returns to a low state. Consequently, the system 400 provides robust operation at low voltages and may operate in a voltage range which may extend to 0.7 volts or lower.

Figure 5:
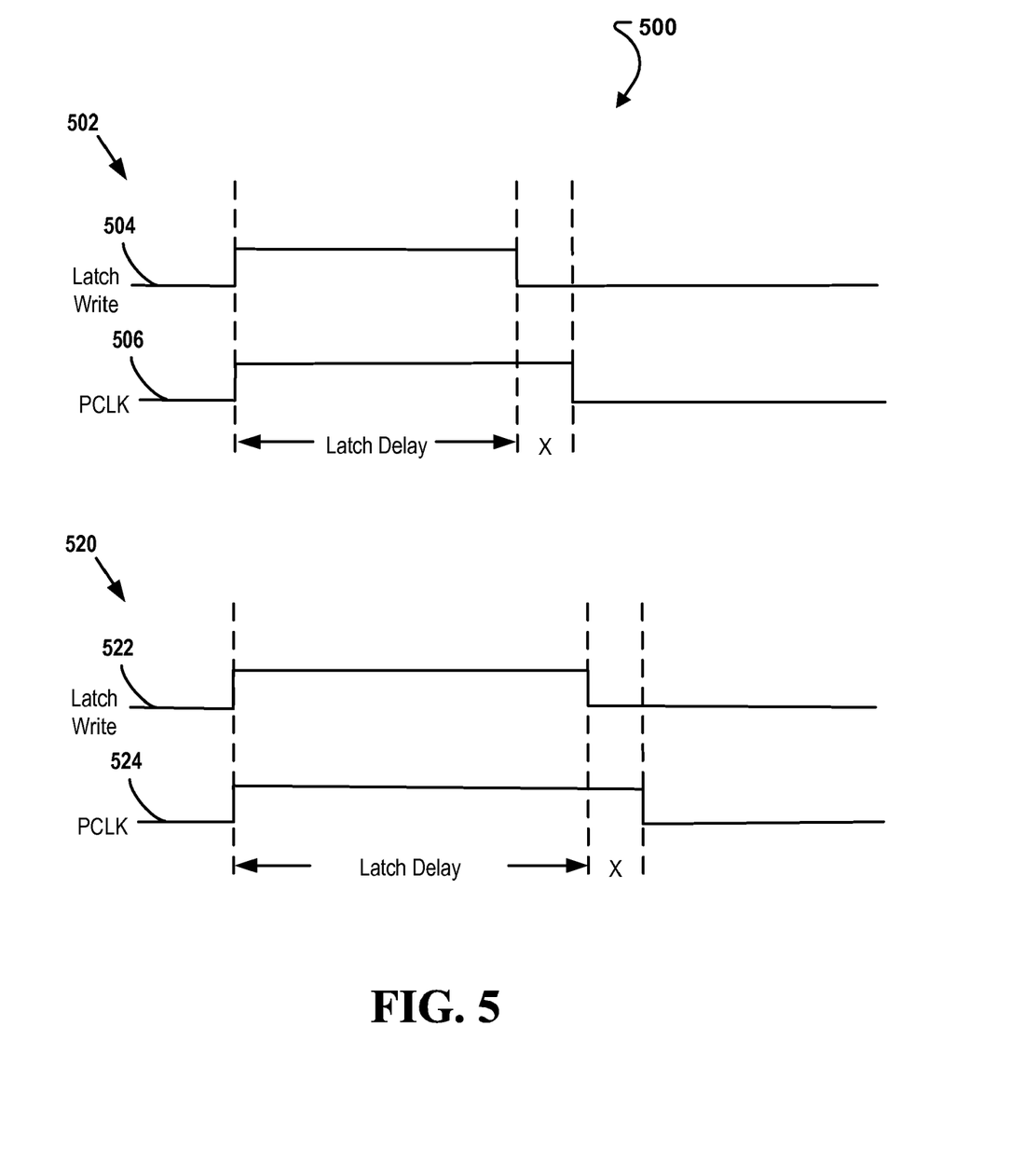
FIG. 5 is a timing diagram illustrating an operation of a system that includes a self-adjusting pulse generator including a latch.

Referring to FIG. 5, an illustrative embodiment of an operation of a system that includes a self-adjusting pulse generator is depicted and generally designated 500. A first timing diagram 502 includes a first latch write signal 504 and a first PCLK signal 506. A second timing diagram 520 includes a second latch write signal 522 and a second PCLK signal 524. The timing diagrams 502 and 520 are illustrative and may not be to scale.

The first timing diagram 502 depicts an operation of a system that includes a self-adjusting pulse generator at a first operating condition, and the second timing diagram depicts an operation of the system that includes a self-adjusting pulse generator at a second operating condition. As an illustrative example, the first timing diagram 502 may represent a performance of the system 100 of FIG. 1 at a first temperature, while the second timing diagram 520 may represent a performance of the system 100 at a second temperature. In a particular embodiment, the timing diagrams 502 and 520 represent a performance of the system 100 of FIG. 1 or the system 200 of FIG. 2 with respect to one or more variations of temperature, voltage, or other condition.

During an operation of a self-adjusting clock pulse system, a data propagation time through a pulse latch may vary with respect to one or more environmental factors, such as voltage, temperature, and manufacturing process. This variation is reflected in the first latch write signal 504 of a pulse latch in a first operating condition and the second latch write signal 522 of the same pulse latch in a second operating condition. As illustrated by the high state of the latch write signals 504 and 522, a latch delay associated with a data propagation time in the first condition is shorter than a latch delay associated with a data propagation time in the second condition.

The first PCLK signal 506, representing an output of a self-adjusting pulse generator in the first operating condition, has a pulse width equal to the latch delay of the first latch write signal 504 plus an additional delay represented by the value X. In a particular embodiment, the value X may be proportional to a delay time of an inverter, such as the inverter 206 of FIG. 2, in addition to other delays, such as a response time of the AND gate 214 of FIG. 2.

Similarly, the second PCLK signal 524, representing the self-adjusting pulse generator in the second operating condition, has a pulse width equal to the latch delay of the second latch write signal 522, plus a delay that is substantially the same as the delay X of the first PCLK signal 506. Thus, the PCLK signals 506 and 524 track a data propagation time of a latch throughout a range of operating conditions. In a particular embodiment, the first operating characteristic of the first timing diagram 502 and the second operating characteristic of the second timing diagram 520 are first and second environmental factors, such as temperature, voltage, or semiconductor device fabrication process.

In an illustrative embodiment, each of the first timing diagram 502 and the second timing diagram 520 correspond to an operation of the system 100 of FIG. 1 in different operating conditions. The latch write signals 504 and 522 may represent data propagation time of one or more of the serially coupled latches 104, 106, and the PCLK signals 506 and 524 may represent an output of the pulse generator 102. A variance of the pulse width at the output of the pulse generator 102 substantially matches a variability of the serially coupled latches arising from environmental factors. Robust operation of the sequentially coupled latches in a wide variety of operating conditions is thus enabled by the self-adjusting pulse generator maintaining a pulse width substantially equal to the latch write delay plus a relatively fixed delay.

Figure 6:
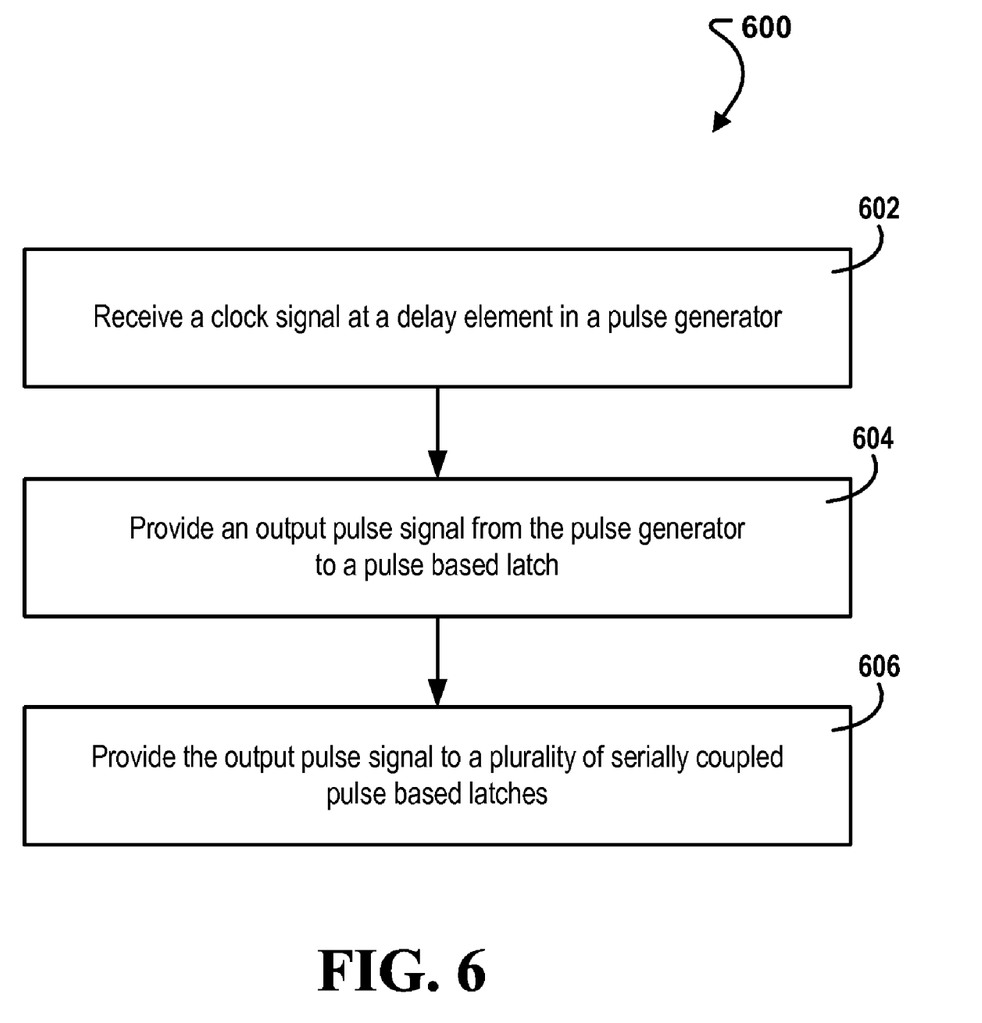
FIG. 6 is a flow diagram of an embodiment of a method of using a self-adjusting pulse generator.

Referring to FIG. 6, a particular illustrative embodiment of a method of using a self-adjusting pulse generator is depicted and generally designated 600. A clock signal is received at a delay element in a self-adjusting pulse generator, at 602. In a particular embodiment, the self-adjusting pulse generator is the pulse generator 102 of FIG. 1 and the delay element is the latch element 120 of FIG. 1.

An output pulse signal is provided from the pulse generator to a pulse based latch, at 604. In a particular embodiment, the output pulse signal is provided to a plurality of pulse based latches, at 606. In an illustrative embodiment, the plurality of serially coupled pulse based latches are the latches 104-106 of FIG. 1.

In a particular embodiment, the delay element has timing delay characteristics that track a data propagation delay of each of the pulse based latches. The data propagation delay may be a time to perform a write at the latch, and delay characteristics of the delay element may be varied without external or feedback control signals. In a particular embodiment, the data propagation delay of the pulse based latch varies based on environmental factors, and the delay characteristics of the delay element substantially matches the variability of the pulse based latch. The environmental factors may include fabrication process, voltage, and temperature.

Figure 7:
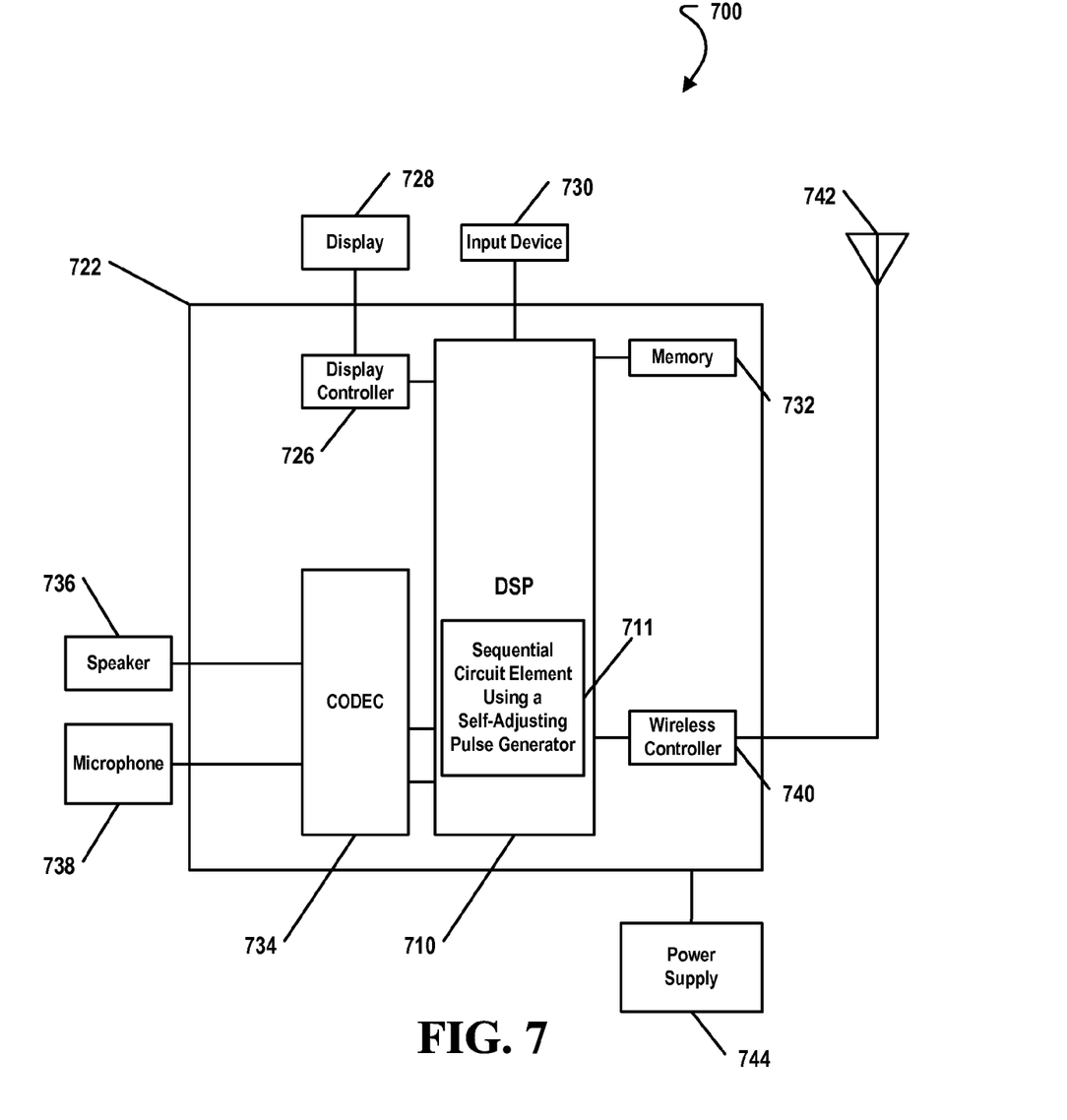
FIG. 7 is a block diagram of a communications device including a self-adjusting pulse generator.

FIG. 7 is a block diagram of a portable communications device that is generally designated as 700 in which the systems and methods of using a latch structure and self-adjusting pulse generator as described with reference to FIGS. 1-6 can be implemented. The portable communications device 700 includes an on-chip system 722 that includes a processor, such as a digital signal processor 710. The digital signal processor 710 includes at least one device having a sequential circuit element using a self-adjusting pulse generator 711, as described with respect to FIGS. 1-6. The sequential circuit element can be a logic latch circuit that is clocked by a pulse generator that uses a latch structure to generate a delay to match a data propagation delay of the logic latch circuit across a wide range of operating conditions.

FIG. 7 also shows a display controller 726 that is coupled to the digital signal processor 710 and to a display 728. Moreover, an input device 730 is coupled to the digital signal processor 710. Additionally, a memory 732 is coupled to the digital signal processor 710. A coder/decoder (CODEC) 734 can also be coupled to the digital signal processor 710. A speaker 736 and a microphone 738 can be coupled to the CODEC 734.

FIG. 7 also indicates that a wireless controller 740 can be coupled to the digital signal processor 710 and to a wireless antenna 742. In a particular embodiment, a power supply 744 is coupled to the on-chip system 722. Moreover, in a particular embodiment, as illustrated in FIG. 7, the display 728, the input device 730, the speaker 736, the microphone 738, the wireless antenna 742, and the power supply 744 are external to the on-chip system 722. However, each is coupled to a component of the on-chip system 722.

In a particular illustrative embodiment, the sequential circuit element using the self-adjusting pulse generator 711 may be used to enhance overall performance of the portable communications device 700. In particular, the sequential circuit element using the self-adjusting pulse generator 711 may enable reduced power consumption of the device 700 by enabling operation at a lower voltage, thereby extending battery life, improving power efficiencies and enhancing the performance of the device 700.

It should be understood that while the sequential circuit element using the self-adjusting pulse generator 711 is shown only within the digital signal processor 710, the sequential circuit element using the self-adjusting clock pulse 711 may be provided in other components, including the display controller 726, the wireless controller 740, the CODEC 734, or any other component that includes sequential logic, such as a logical latch circuit, a logical flip-flop circuit, or other clocked circuitry.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in RAM memory, flash memory, ROM memory, PROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a computing device or a user terminal. In the alternative, the processor and the storage medium may reside as discrete components in a computing device or user terminal.

The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the scope of the disclosure. Thus, the present disclosure is not intended to be limited to the embodiments shown herein but is to be accorded the widest scope consistent with the principles and novel features as defined by the following claims.

What is claimed is:

1. A system comprising:
   a first latch; and
   a pulse generator coupled to provide a timing signal to the first latch,
   wherein the pulse generator includes a second latch that has characteristics matching the first latch, the pulse generator further comprising:
   the second latch responsive to a clock input; and
   a logic circuit coupled to the clock input and coupled to an output of the second latch, the logic circuit to provide a pulse output including at least one pulse having a pulse width that varies in response to a data propagation time of the second latch, wherein the pulse width is associated with a delay time that includes an inverter delay time and the data propagation time of the second latch, wherein the logic circuit includes circuitry that performs a logical AND function with respect to an output of the second latch as a first input to the AND and the clock input as a second input to the AND, wherein the circuitry includes multiple transistors and an output inverter, wherein the output inverter provides the pulse output, and wherein the logic circuit further includes an enable input to selectively enable generation of the pulse output.

2. The system of claim 1, wherein the timing signal is responsive to an output of the AND.

3. The system of claim 1, further comprising a plurality of latches having characteristics matching each of the first latch and the second latch.

4. The system of claim 3, wherein each of the first latch and the plurality of latches are pulse latches.

5. The system of claim 3, wherein each of the first latch, the second latch, and the plurality of latches includes a first transistor, a second transistor, a first inverter, and a second inverter, the first inverter coupled to the first transistor and the second inverter coupled to the second transistor.

6. The system of claim 5, wherein the first latch has a data line that is coupled, via the first inverter, to a terminal of the first transistor, and wherein the data line is further coupled, via the second inverter that is coupled to the first inverter, to a terminal of the second transistor.

7. A pulse generator, comprising:
   a latch responsive to a clock input; and
   a logic circuit coupled to the clock input and coupled to an output of the latch, the logic circuit to provide a pulse output including at least one pulse having a pulse width that varies in response to a data propagation time of the latch, wherein the pulse width is associated with a delay time that includes an inverter delay time and the data propagation time of the latch, wherein the logic circuit includes circuitry that performs a logical AND function with respect to an output of the latch as a first input to the AND and the clock input as a second input to the AND, wherein the circuitry includes multiple transistors and an output inverter, wherein the output inverter provides the pulse output, and wherein the logic circuit further includes an enable input to selectively enable generation of the pulse output.

8. The pulse generator of claim 7, wherein the pulse output is to be communicated to a latch device and wherein the latch has similar characteristics as the latch device.

9. The pulse generator of claim 7, wherein the latch has a data line that is coupled, via a first inverter, to a terminal of a first transistor and that is coupled, via a second inverter that is coupled to the first inverter, to a terminal of a second transistor.

10. The pulse generator of claim 7, wherein the latch comprises:
    a first transistor;
    a second transistor; and
    a data line that is coupled, via a first inverter, to a terminal of the first transistor and that is coupled, via a second inverter that is coupled to the first inverter, to a terminal of the second transistor.

11. The latch of claim 10, wherein data is writable using the data line such that the data latched is fully differential.

12. A method comprising:
    receiving a clock signal at a delay element in a pulse generator; and
    providing an output pulse signal from the pulse generator to a pulse based latch;
    wherein the delay element has timing delay characteristics that track a data propagation delay of the pulse based latch, and wherein the pulse generator comprises:
    a latch responsive to a clock input; and
    a logic circuit coupled to the clock input and coupled to an output of the latch, the logic circuit to provide a pulse output including at least one pulse having a pulse width that varies in response to a data propagation time of the latch, wherein the pulse width is associated with a delay time that includes an inverter delay time and the data propagation time of the latch, wherein the logic circuit includes circuitry that performs a logical AND function with respect to an output of the latch as a first input to the AND and the clock input as a second input to the AND, wherein the circuitry includes multiple transistors and an output inverter, wherein the output inverter provides the pulse output, and wherein the logic circuit further includes an enable input to selectively enable generation of the pulse output.

13. The method of claim 12, wherein the data propagation delay of the pulse based latch is variable based on environmental factors and wherein the delay characteristics of the delay element substantially match the variability of the pulse based latch.

14. The method of claim 13, wherein the environmental factors include fabrication process, voltage, and temperature.

15. The method of claim 13, further comprising providing the output pulse signal to a plurality of serially coupled pulse based latches.

16. The method of claim 13, wherein the timing delay characteristics of the delay element are varied without external or feedback control signals.

17. The method of claim 12, wherein the data propagation delay is a time to perform a write at the pulse based latch.

18. A method comprising:
    providing a pulse signal with pulses having a first pulse width to a plurality of latches during a first operating condition, the first operating condition affected by a first environmental factor; and
    providing the pulse signal with pulses having a second pulse width to the plurality of latches during a second operating condition, the second operating condition affected by a second environmental factor,
    wherein the second pulse width varies with respect to the first pulse width in response to
    a difference between the second environmental factor and the first environmental factor, wherein the variance of the second pulse width substantially matches a variability of at least one of the plurality of latches, and wherein the pulse signal is provided by a pulse generator, the pulse generator comprising:

a latch responsive to a clock input; and a logic circuit coupled to the clock input and coupled to an output of the latch, the logic circuit to provide a pulse output including at least one pulse having a pulse width that varies in response to a data propagation time of the latch, wherein the pulse width is associated with a delay time that includes an inverter delay time and the data propagation time of the latch, wherein the logic circuit includes circuitry that performs a logical AND function with respect to an output of the latch as a first input to the AND and the clock input as a second input to the AND, wherein the circuitry includes multiple transistors and an output inverter, wherein the output inverter provides the pulse output, and wherein the logic circuit further includes an enable input to selectively enable generation of the pulse output.

19. The method of claim 18, wherein the second pulse width is varied automatically without external control.

20. The method of claim 18, wherein the first environmental factor is one or more of temperature, voltage, or semiconductor device fabrication process.

* * * * *

UNITED STATES PATENT AND TRADEMARK OFFICE
CERTIFICATE OF CORRECTION

PATENT NO. : 7,724,058 B2
APPLICATION NO. : 11/930915
DATED : May 25, 2010
INVENTOR(S) : Saint-Laurent et al.

Page 1 of 1

It is certified that error appears in the above-identified patent and that said Letters Patent is hereby corrected as shown below:

Column 9, line 21, claim 1: "an output" to read as --the output--

Column 9, line 56, claim 7: "an output" to read as --the output--

Column 10, line 31, claim 12: "an output" to read as --the output--

Column 11, line 12, claim 18: "an output" to read as --the output--

Signed and Sealed this
Twelfth Day of July, 2011

David J. Kappos
*Director of the United States Patent and Trademark Office*